United States Patent
Yasuda

(10) Patent No.: US 9,070,527 B2
(45) Date of Patent: Jun. 30, 2015

(54) ELECTRON GUN AND ELECTRON BEAM DEVICE

(75) Inventor: Hiroshi Yasuda, Hasuda (JP)

(73) Assignee: Param Corporation, Tokyo (JP)

( * ) Notice: Subject to any disclaimer, the term of this patent is extended or adjusted under 35 U.S.C. 154(b) by 129 days.

(21) Appl. No.: 14/000,988

(22) PCT Filed: Feb. 25, 2011

(86) PCT No.: PCT/JP2011/054377
§ 371 (c)(1),
(2), (4) Date: Oct. 28, 2013

(87) PCT Pub. No.: WO2012/114521
PCT Pub. Date: Aug. 30, 2012

(65) Prior Publication Data
US 2014/0055025 A1    Feb. 27, 2014

(51) Int. Cl.
*H01J 29/48* (2006.01)
*H01J 1/148* (2006.01)
*H01J 1/26* (2006.01)
*H01J 37/075* (2006.01)
*H01J 37/317* (2006.01)
*H01J 37/065* (2006.01)
*H01J 37/07* (2006.01)
(Continued)

(52) U.S. Cl.
CPC ............... *H01J 29/485* (2013.01); *H01J 1/148* (2013.01); *H01J 1/26* (2013.01); *H01J 37/075* (2013.01); *H01J 37/3174* (2013.01); *H01J 37/065* (2013.01); *H01J 37/07* (2013.01); *H01J 37/26* (2013.01); *B82Y 10/00* (2013.01); *B82Y 40/00* (2013.01)

(58) Field of Classification Search
CPC ..................................................... H01J 29/485
USPC ........ 313/409, 414, 402, 477 HC, 477 R, 456
See application file for complete search history.

(56) References Cited

U.S. PATENT DOCUMENTS 4,468,586 A    8/1984    Hohn
4,647,153 A    3/1987    Utsumi et al.
(Continued)

FOREIGN PATENT DOCUMENTS

EP    0363055 A2    4/1990
JP    S55-014646 A    2/1980
(Continued)

OTHER PUBLICATIONS

International Search Report corresponding to co-pending International Patent Application Serial No. PCT/JP2011/054377, Japanese Patent Office, dated May 24, 2011; (4 pages).
(Continued)

*Primary Examiner* — Elmito Breval
(74) *Attorney, Agent, or Firm* — Nixon Peabody LLP

(57) ABSTRACT

An electron gun cathode (104) is column shaped, and emits electrons by being heated. A holder (103), which covers the bottom and sides of the electron gun cathode, has electrical conductivity and holds the electron gun cathode, and is composed of a material that does not easily react with the electron gun cathode when in a heated state, is provided. The tip of the electron gun cathode (104) protrudes from the holder (103) so as to be exposed, and electrons are emitted from the tip toward the front by applying an electric field to the tip.

5 Claims, 12 Drawing Sheets

(51) Int. Cl.
  *H01J 37/26* (2006.01)
  *B82Y 10/00* (2011.01)
  *B82Y 40/00* (2011.01)

(56) References Cited

U.S. PATENT DOCUMENTS

| 5,808,309 | A | 9/1998 | Spehr et al. |
| 6,556,651 | B1 | 4/2003 | Thomson et al. |
| 6,828,996 | B2 | 12/2004 | Howard et al. |

FOREIGN PATENT DOCUMENTS

| JP | 57-196445 A | 12/1982 |
| JP | S58-65004 U | 5/1983 |
| JP | S62 241254 A | 10/1987 |
| JP | 63-032846 A | 2/1988 |
| JP | 63-178053 U | 11/1988 |
| JP | 02-098921 A | 4/1990 |
| JP | 03-274632 A | 12/1991 |
| JP | 05-128963 A | 5/1993 |
| JP | 06-181029 A | 6/1994 |
| JP | 08-050873 A | 2/1996 |
| JP | 08-212952 A | 8/1996 |
| JP | H10-125268 A | 5/1998 |
| JP | 2000-235839 A | 8/2000 |
| JP | 2003 217448 A | 7/2003 |
| JP | 2005-516652 A | 6/2005 |
| JP | 2009-231404 A | 10/2009 |

OTHER PUBLICATIONS

Electron/Ion beam handbook, 3rd edition with English Excerpts; Japan Society for the promotion of Science, 132 Committee, Nikkan Kogyo Shingun sha; dated Oct. 28, 1998; (4 pages).

Office Action mailed Aug. 26, 2014, which issued in corresponding International Patent Application No. PCT/JP2011/054377 (w/partial English translation) (5 pages).

Extended Search Report mailed Sep. 8, 2014, which issued in corresponding European Patent Application No. 11859058.7-1556 (6 pages).

ELECTRON GUN AND ELECTRON BEAM DEVICE

CROSS-REFERENCE TO RELATED APPLICATIONS

This application is a U.S. National Stage of International Application No. PCT/JP2011/054377, filed Feb. 25, 2011, which is incorporated herein by reference in its entirety.

TECHNICAL FIELD

The present invention relates to an electron gun for emitting electrons. The present invention also relates to an electron beam device such as an electron beam exposure device or an electron beam inspection device such as an electron microscope, in which an electron gun is used.

BACKGROUND ART

In the field of lithography for exposing a circuit pattern in the process of manufacturing a semiconductor (LSI), electron beam exposure technology is being utilized. Specifically, in the semiconductor lithography technology, photochemical process technology (photolithography) has been mainly used, in which a mask, serving as an original pattern, is generally created by an electron beam exposure device and the mask image is optically transferred onto a semiconductor substrate (wafer).

Electron beam exposure systems have been developed, starting from a method called one-stroke sketch (a picture drawn with a single stroke of the brush) with narrowly-focused electron beams, to a variable rectangular method, a method called character projection (CP) in which one-shot exposure of several square microns is performed with a micro mask, and so on.

In such an electron beam exposure device, an electron gun which emits an electron beam is significant. In Non-Patent Document 1, for example, a method of holding and a method of heating an electron gun cathode, which is of a type called Vogel mount type, are used. The electron gun in this document is configured such that an electron gun cathode, which is an electron generation source, is sandwiched by pyrolytic graphite (PG) members functioning as heating elements on respective sides and is further pressed and held, on the respective sides, by metal springs. The heating state of the PG members is controlled with electric current which is caused to flow in the PG members, and thermoelectron emission conditions are obtained. This conventional electron gun will be described with reference to FIG. 13.

This electron gun cathode is composed of a single crystal chip 801 of LaB6 or CeB6 having conductivity and a work function for generating electrons; i.e. about 2.6 eV, and two pyrolytic graphite members 802a and 802b, which are cut with a plane vertical to the C-axis direction, sandwiching the chip 801. This structure is further held by metal supports 803a and 803b and further urged by components 804a and 804b forming springs at an appropriate pressure. The force of the spring is adjusted by rotating clamping screws 806a and 806b to vary a quantity of protrusion thereof from supports 805a and 805b. The supports 805a and 805b have end portions fixed to an alumina ceramic disc 807 and are electrically insulated from each other. The supports 805a and 805b have leg portions that are electrically in contact with electricity introduction terminals 808a and 808b, respectively, and with application of electric current of several amperes, the pyrolytic graphite members 802a and 802b are heated to maintain the single crystal chip 801 of LaB6 or CeB6 at a high temperature of about 1500° C., thereby allowing the single crystal chip 801 to operate as a thermal electron gun cathode or a thermal field emission cathode.

The Vogel mount type electron gun cathode described above, which is formed of an LaB6 or CeB6 single crystal chip fixed by two pyrolytic graphite members on the respective sides with springs, has a disadvantage that the structure of the electron gun cathode is complicated, which makes alignment of the central axis of electrons relatively difficult. Another disadvantage is that, because heating is performed by electric current, in the case of manufacturing a high voltage source for a multi-column device having, for example, several tens of columns, a circuit for generating a large amount of electric current of a total of several tens to several hundreds of amperes for a high voltage source of several tens of kV (e.g, about −50 kV) is mounted, which results in an increase in the capacity of the high voltage source. Further, in order to transmit electric current of several amperes to individual electron guns, an electric wire line having a diameter of several millimeters or greater, for example, is necessary, and, in consideration of high voltage insulation, the wire lines must be covered with an insulating material such as a rubber, which will increase the diameter of the wire line to at least about 10 mm or greater. As such, several tens or more electric wire lines whose diameters are thus doubled because of heating by electric current are necessary, forming a power source cable having a cross section with a diameter of about ten and several centimeters. Consequently, as mechanical vibrations are propagated from the power source cable to the multi-column mounted on a vibration-preventing stand, it is not possible to draw a pattern with accuracy of 1 nm or less.

Patent Documents 1 and 2 disclose technology for radiating laser light in a non-contact manner from a front surface side or a back surface side of the tip portion of the electron gun cathode material to thereby effectively heat the electron gun cathode, thereby extracting a large quantity of electron beams.

PRIOR ART DOCUMENTS

Patent Documents

Patent Document 1: JP 8-212952 A
Patent Document 2: JP 6-181029 A

Non Patent Document

Non Patent Document 1: *Electron/Ion beam handbook*, 3rd edition. Japan: Japan Society for the Promotion of Science, 132 Committee, Nikkan Kogyo Shingun sha, Oct. 28, 1998.

DISCLOSURE OF THE INVENTION

Technical Problems

Here, lanthanum hexaboride compounds such as LaB6 ($LaB_6$) and CeB6 ($CeB_6$) are often used as an electron gun cathode material. In particular, it is general practice that a thermal electron gun having a sharp-pointed tip of LaB6 is used at a high temperature of 1800K or higher. Further, an electric field emission electron gun for extracting electrons by electric field includes an electron gun cathode (e.g., LaB6) which has a large surface area of several square millimeters and is used in an exposed manner as a whole.

In this case, as a large quantity of electrons are output from the whole electron gun cathode including sides of the tip portion and also the temperature is as high as 1800K or higher, sublimation of the material is significant. This results in formation of whiskers of sublimation adhering substances on the surface of an anode and an extraction electrode, which makes it impossible to use the device after discharge occurs. Simultaneously, the volume of the electron gun material is reduced in a manner that the tip surface is lowered and the side surfaces are also reduced in size. A change in the shape of the tip portion as described above makes it further impossible to extract electrons therefrom as desired. Further, with long-term use of the electron gun at a high temperature of 1800K, in the case of LaB6, for example, boron (B) atoms and lanthanum (La) atoms are removed from the crystal, making the crystal fragile and non-dense or cracked. This results in an increase in the work function, so that a state with high brightness (a state in which sufficient electrons can be extracted) cannot be maintained unless the temperature is further increased. However, such a further increase in the temperature would make sublimation and evaporation all the more intense.

If an electron gun is used as an electric field emission type electron gun in which an intense electric field is applied to increase the electric field of the tip of the electron gun, it is possible to use such an electron gun at a lower temperature due to the intense electric field. As a result, the temperature of the electron gun cathode material can be as low as 1700K or lower, such as 1650K and 1600K, so that sublimation of the material or the like can be reduced. In this case, however, similar to the above case, whiskers of sublimation adhering substances are formed on the surfaces of the anode and the extraction electrodes or the shape of the cathode material changes. A further decrease in sublimation and evaporation of the cathode material is therefore desired.

Solution to Problems

In accordance with an aspect of the present invention, there is provided an electron gun, comprising an electron gun cathode for emitting electrons by being heated, the electron gun cathode having a column shape; and a holder configured to cover the bottom and side surfaces of the electron gun cathode in an electron gun holding portion at a tip thereof and hold the electron gun cathode, the holder having electrical conductivity and being formed of a material that is hard to react with the electron gun cathode in a heated state, and the holder having a tapered shape as a whole projecting toward the electron gun holding portion, wherein the electron gun cathode has a tip portion that is exposed to protrude from the holder, and, with application of electric field to the tip portion, emits electrons from the tip portion toward a forward direction.

Preferably, the electron gun cathode has a flat surface at the tip thereof, and emits electrons from the flat surface.

Preferably, the tip portion of the electron gun cathode is tapered.

Preferably, the electron gun cathode is formed of one material selected from lanthanum hexaboride compounds including LaB6 and CeB6.

Preferably, the holder is formed of rhenium.

Preferably, the holder has a recess portion for holding the electron gun cathode at a tip portion.

Preferably, the holder has a slit extending from a tip side to an intermediate portion through the recess portion, and clamps the electron gun cathode with an elastic force of the holder.

Preferably, the holder is coupled with an optical waveguide on a base side of the holder opposite the tip side thereof where the electron gun is held, and the electron gun cathode is heated, via the holder, by light supplied through the optical waveguide.

Preferably, the holder has a slit extending from the tip side to an intermediate portion, and clamps the electron gun cathode with an elastic force of the holder, the holder further has a slit extending from the base side to the intermediate portion, and clamps the optical waveguide with an elastic force of the holder, and the slit for clamping the electron gun cathode and the slit for clamping the optical waveguide are spatially orthogonal to each other with respect to an axis of the holder.

Preferably, in accordance with another aspect of the invention, there is provided an electron beam device comprising an electron gun; a beam controller configured to extract electrons from the electron gun and direct the electrons; and a target holding portion for holding a target to be irradiated with the electrons from the beam controller, wherein the electron gun comprises an electron gun cathode for emitting electrons by being heated, the electron gun cathode having a columnar shape; and a holder configured to cover bottom and side surfaces of the electron gun cathode and hold the electron gun cathode, the holder having electrical conductivity and being formed of a material that is hard to react with the electron gun cathode in a heated state and the holder having a tapered shape as a whole projecting toward the electron gun holding portion, wherein the electron gun cathode has a tip portion that is exposed to protrude from the holder, and, with application of an electric field to the tip portion, emits electrons from the tip portion toward a forward direction.

The electron beam device includes an electron beam exposure device or an electron beam inspection device such as an electron microscope.

Advantageous Effects of Invention

According to the present invention, a holder covers the bottom and sides of an electron gun cathode, while the tip of the electron gun cathode protrudes from the holder. With this configuration, emission of electrons and electron gun cathode material from the sides of the electron gun cathode can be reduced, so that the life of the electron gun can be extended.

BEST MODE FOR CARRYING OUT THE INVENTION

A preferred embodiment of the present invention will be described with reference to the drawings.

"Configuration of Electron Gun"

Figure 1:
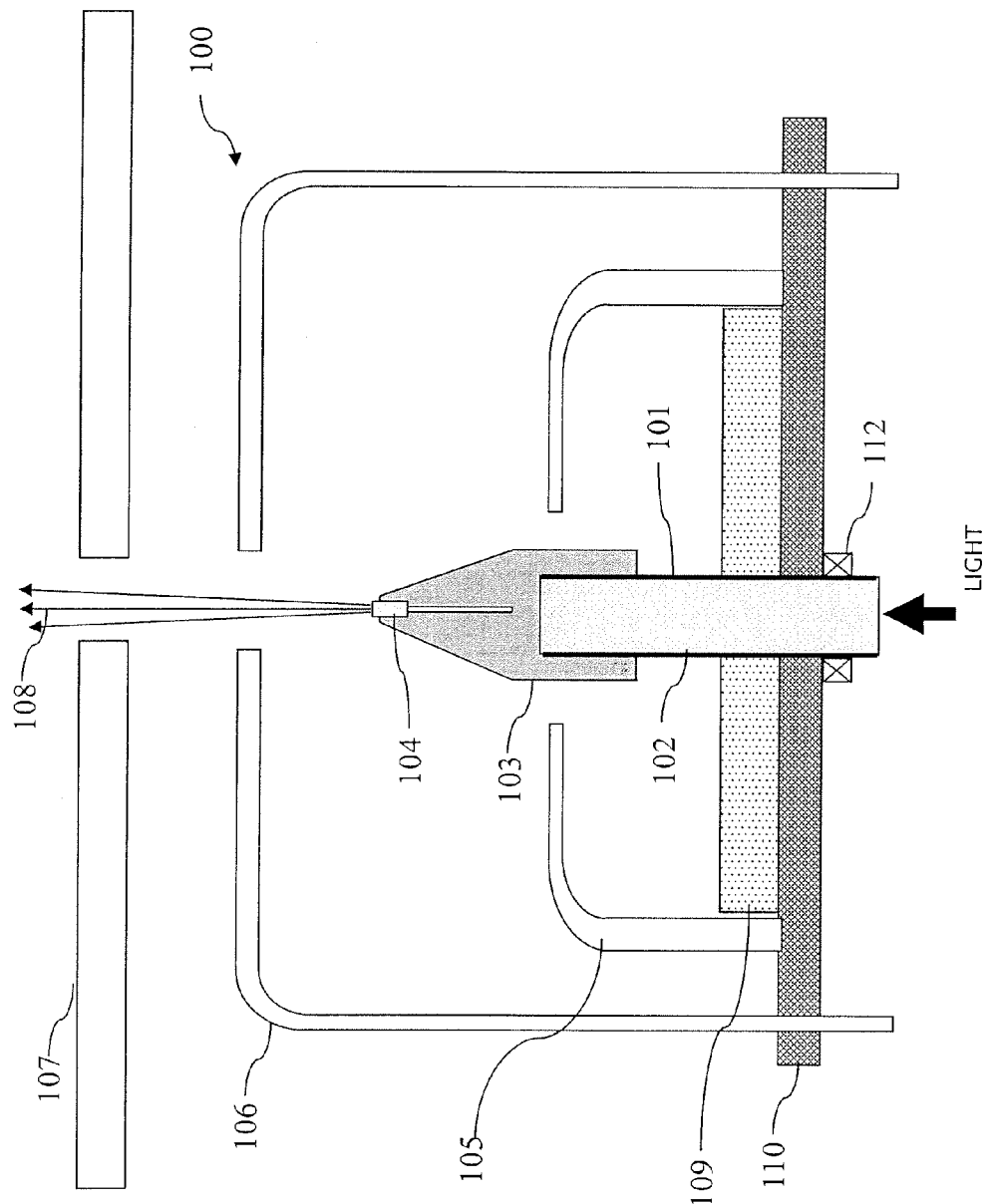
FIG. 1 View illustrating a configuration of an electron gun according to an embodiment.

FIG. 1 is a view illustrating a configuration of an electron gun 100 according to an embodiment. In this example, the electron gun 100 adopts an optical heating method.

Referring to FIG. 1, light with a high energy density enters through one end portion (i.e., a light entry end at the lower portion in the figure) of a cylindrical optical waveguide 102 formed of sapphire, and further enters a holder 103 disposed on the opposite end portion (a tip portion) of the optical waveguide 102. In this example, the holder 103 is composed of a cylindrical portion on the base side and a conical portion on the tip side and is formed of rhenium as a whole. The holder 103 includes a cylindrical recess portion formed on the base side, into which the tip portion of the optical waveguide 102 is fitted.

The conical portion of the holder 103 has a truncated-conical shape with a tip portion thereof being removed, and the conical portion has an inwardly recessed portion on the tip surface and also a slit extending through this recessed portion toward the base side. An electron gun cathode 104 is inserted into the recessed portion from the tip side thereof so as to expand the slit such that the electron gun cathode 104 is held by an elastic force of the holder 103.

Light is guided from a light source to the optical waveguide 102 by means of optical fibers and the like, and enters and is absorbed in the holder 103, to thereby heat the electron gun cathode 104, via the holder 103, to a high temperature. Accordingly, with the adjustment of light intensity, conditions for emitting electrons from the electron gun cathode 104 into vacuum can be obtained.

Light in this case is light emitted from a semiconductor laser, for example. Concerning the wavelength of the light, although visible light is suitable for optical axis alignment, light from ultraviolet rays to infrared rays may also be used.

The optical waveguide 102 is a transmission path of light and allows light entering from the entry end thereof to undergo total reflection on the side surfaces and guides the light forward, thereby transmitting the light without dissipation in the holder 103. The optical waveguide 102 is also a support member for mechanically supporting the holder 103 and the electron gun cathode 104 and therefore needs to have heat resistance to a high temperature (about 1500° C.) at which the electron gun cathode 104 obtains the electron emitting conditions. The optical waveguide 102 further has a function of serving as an electron supply path to the electron gun cathode 104. This function as an electron supply path is necessary for supplying electrons to be emitted into a vacuum from the electron gun cathode 104 through the holder 103.

Materials suitable for the optical waveguide 102 described above include sapphire, ruby, diamond, and silica glass, for example, which can transmit light and have a high melting point. As these materials have high insulation properties, conductivity is imparted to realize an electron supply path for supplying electrons to be emitted from the electron gun cathode 104. In this example, a rhenium thin film is formed by vapor deposition or sputtering on the surface of the optical waveguide 102 to adhere thereto a metal film 101 having a thickness of about several hundred nm. Alternatively, one type ion selected from bromine, nitrogen, oxygen, fluorine, aluminum, phosphor, sulfur, chlorine, gallium, and arsenic may be implanted on the surface layer of the optical waveguide 102 with ion implantation technology, thereby imparting conductivity thereto.

Alternatively, even when the optical waveguide 102 itself is an insulation substance, a separate conductor may be provided for supplying electrons to the electron gun cathode 104. In this case, an electron supply terminal is provided in the electron gun cathode 104 and is connected with an electron gun source with a wire line, so that electrons to be emitted from the electron gun cathode 104 are supplied from the electron gun source.

Here, sapphire is the most suitable due to its light transmittance, heat resistance, and workability. Accordingly, in the present embodiment, sapphire is selected as a material of the optical waveguide 102 from among the materials including sapphire, ruby, diamond, and silica glass.

A preferable shape of the optical waveguide 102 is a cylinder having a diameter which facilitates entry of light from the optical fiber which transmits light from the light source to the optical waveguide 102. The shape of the optical waveguide 102 may be a conical shape which is tapered and has a decreasing diameter toward the tip. Further, the optical waveguide 102 may be a structure with different materials and shapes which allows light to reflect within an inner surface of a hollow metal cylinder to thereby propagate light to the tip portion.

The holder 103 is a heating element which light enters and which absorbs light, and is also a structure for supporting the electron gun cathode 104. The holder 103 must be formed of a material capable of providing a protection function for preventing a chemical reaction with LaB6 or CeB6 which is an electron gun cathode material, at the operation temperature (about 1500° C.) of an electron gun, and rhenium, tantalum, graphite (carbon), and the like can be used. Among these materials, rhenium is the most suitable, because the reaction with the electron gun cathode material at a high temperature is the least. Accordingly, in the present embodiment, rhenium is used for the holder 103.

The chemical reaction protection function described above is necessary in order to prevent the electron gun cathode material such as LaB6 and CeB6 from chemically reacting with many types of materials except some materials including rhenium, tantalum, graphite (carbon), and so on, at the operation temperature of an electron gun, which would otherwise result in degradation and the loss of electron gun properties.

The materials that do not undergo chemical reaction with LaB6 and CeB6 include carbon and tantalum, as described above. Because, as found from an actual experiment, carbon tatters and is removed off at 1700K, it appears difficult to actually use carbon. On the other hand, while tantalum is considered to not react relatively, tantalum does react with LaB6 to form TaB2 and remove La. Accordingly, in the case of the electron gun cathode 104 with small crystals as in the present embodiment, it appears that components of tantalum will change in a relatively short time, such as shorter than one month, for example, which is not practical.

The holder 103 is shaped so as to include, on the base side, a cylinder having a diameter greater than that of the optical waveguide 102 and having a hole (recess portion) at an end in which the optical waveguide 102 is inserted and fitted and to further include, on the tip side, a truncated cone having a hole (recess portion) at an end in which the electron gun cathode 104 is inserted and fitted, as described above.

For the electron gun cathode 104, one material is selected and used from among lanthanum hexaboride compounds such as LaB6 and CeB6 that emit thermoelectons or thermal field emission electrons at high temperature. Lanthanide series belongs to the sixth periods and the third family (3 A) in the periodic table and is a generic name of 15 elements having similar chemical properties, ranging from lanthanum (La) of atomic number 57, as a representative element, to ruthenium Ru of atomic number 71.

As the electron gun properties, it is desirable that the electron gun cathode 104 is a single crystal. Further, the operating temperature of the electron gun cathode 104 being a high temperature (about 1500° C.) refers to, at that temperature, the work function of LaB6 or CeB6 is 2.6 eV and emission of thermoelectrons can be achieved.

A suppressor electrode 105 is provided toward the forward side of the tip of the electron gun cathode 104 around the passage of the electron beams so as to form the passage. The suppressor electrode 105 has 0 potential with respect to the electron gun cathode 104 and suppresses emission of electrons from side surfaces of the optical waveguide 102.

An extraction electrode 106 is further provided toward the forward side of the suppressor electrode 105 so as to form the passage for electron beams. A potential of about +3 kV to about +10 kV with respect to the electron gun cathode 104 is applied to this extraction electrode 106 and is applied to a portion near the upper surface of the tip portion of the cylinder having a diameter of 100 μm of the electron gun cathode 104, from which thermal field emission electrons are emitted toward an electron gun anode 107.

The electron gun anode 107 normally has a ground potential (0V), and applies a voltage of −several tens of kV (e.g. −50 kV) for accelerating the electron beam to the electron gun cathode 104 and supplies kinetic energy of several tens of keV (e.g., 50 keV) to the thermal field emission electrons, thereby obtaining the electron beam 108. As a result, the potential of the electron gun cathode 104 is about −50 kV and the potential of the extraction electrode 106 is about −47 kV to about −40 kV. With this configuration, the whole structure illustrated in FIG. 1 functions as the electron gun 100.

An insulation base 109 is an alumina ceramic disk and has the optical waveguide 102 fixed in the center thereof. While the insulation base 109 can insulate between the suppressor electrode 105 and the optical waveguide 102, the potential of the suppressor electrode 105 may be made the same as that of the optical waveguide 102.

An insulation base 110 having a diameter which is larger than that of the insulation base 109 holds the insulation base 109 from below and supports the optical waveguide 102 in the center thereof, and also holds the base portions of the suppressor electrode 105 and the extraction electrode 106 concentrically on the outer side of the insulation base 109 so as to be spaced from each other. Further, the insulation base 110 insulates the extraction electrode 106 and the optical waveguide 102.

A conductive ring 112 is attached to an end portion of the optical waveguide 102 and contacts the outer surface of the insulation base 110 and also contacts a metal film 101 formed of a conductive material on the outer surface of the optical waveguide 102. An electron beam acceleration power source is connected to this conductive ring 112 for supplying electrons to be emitted from the electron gun cathode 104 via the holder 103.

Figure 2:
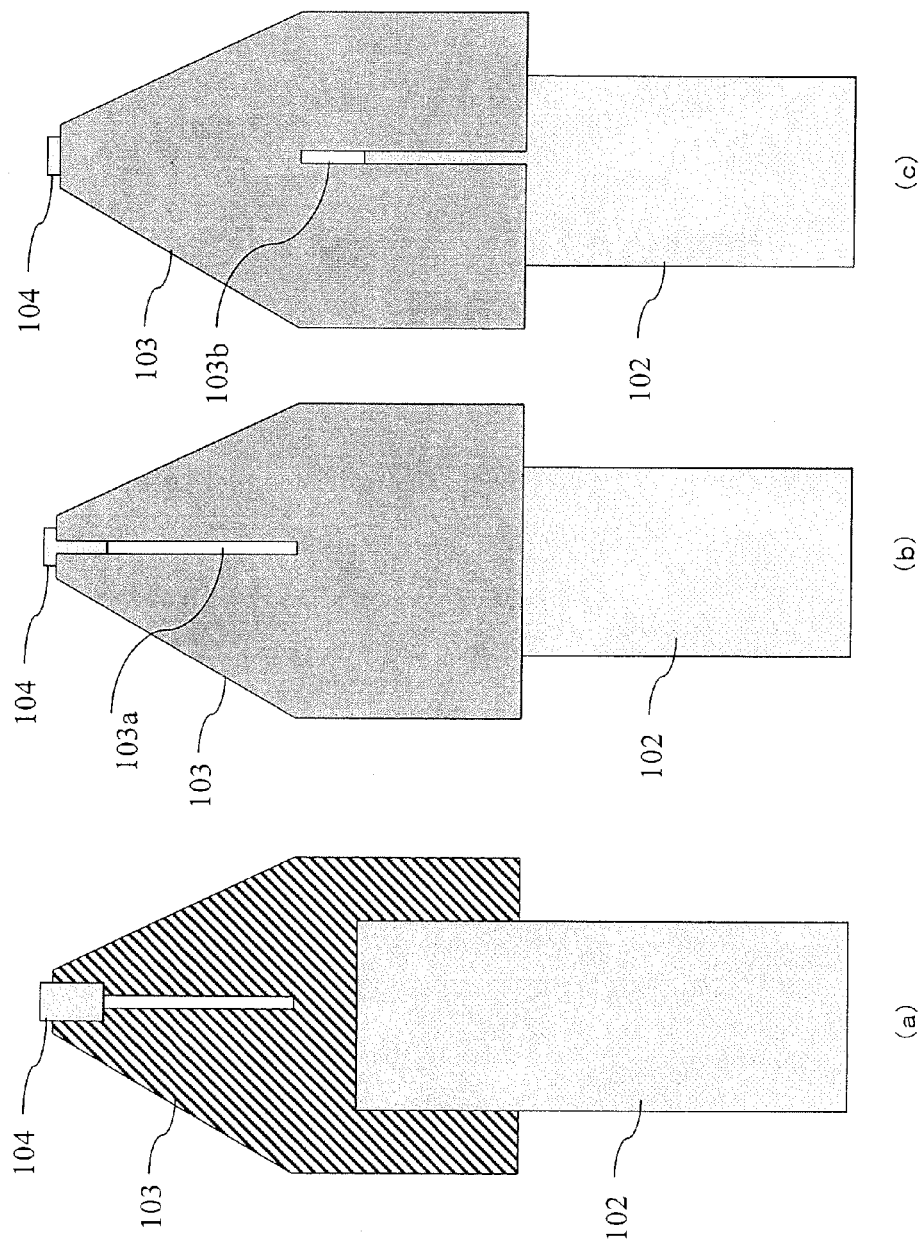
FIG. 2 View illustrating configurations of a holder and an electron gun cathode.

FIGS. 2(a), 2(b), and 2(c) illustrate a structure for connection among the holder 103, the electron gun cathode 104, and the optical waveguide 102. FIG. 2(a) is a view including a cross sectional view of the holder 103 and drawn such that the electron gun cathode 104 and the optical waveguide 102 are visible; FIG. 2(b) is a front view; and FIG. 2(c) is a side view. In this example, the holder 103 includes a slit 103a extending from the tip side to an intermediate portion, and a slit 103b extending from the base side to the intermediate portion. These slits extend in directions that differ by 90 degrees in the plane direction (top-down direction). More specifically, with respect to the axial direction of the holder, the slits 103a and 103b are spatially orthogonal to each other. The holder 103 also includes, at the tip thereof, a hole (recess portion) in a cylindrical shape in which the electron gun cathode 104 is inserted and fitted and includes, at the end portion on the base side, a hole (recess portion) in a cylindrical shape in which the optical waveguide 102 is inserted and fitted. As the electron gun cathode 104 and the optical waveguide 102 are slightly larger than these holes, the electron gun cathode 104 and the optical waveguide 102, when inserted into the holes, are held by the holder 103 with an elastic force of the holder 103. For example, it is preferable that the electron gun cathode 104 is a square column having a size of 50 μm (micrometers)×50 μm and a length of 100 μm and the corresponding hole is a round hole having a diameter of about 70 μm, such that the tip of the electron gun cathode 104 protrudes from the hole by the length of about 10 μm.

While in the above example, the holder 103 is divided into two sections by one slit, the holder may be divided into three or four sections for providing a spring function.

It is also preferable that a slot is previously formed in the electron gun cathode 104 and the optical waveguide 102 and, with the irradiation of a welding laser, the material of the holder 103 is melted into the slots to thereby bond the holder 103 to the electron gun cathode 104 and the optical waveguide 102.

Figure 3:
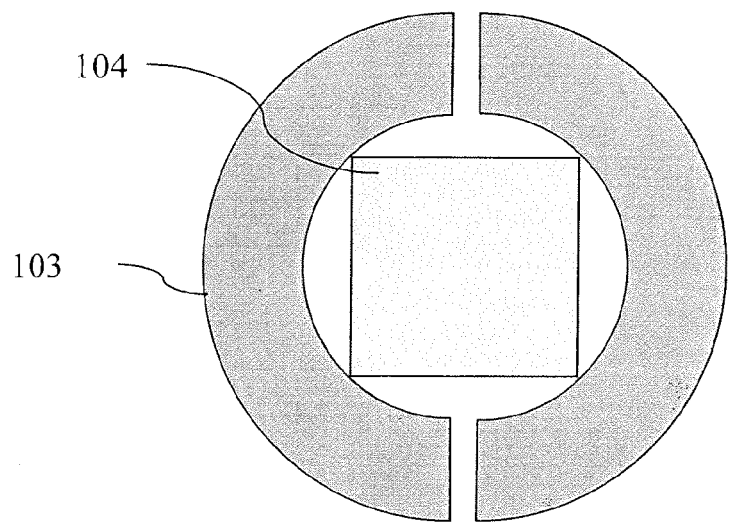
FIG. 3 View illustrating configurations of a holder and an electron gun cathode.
Figure 4:
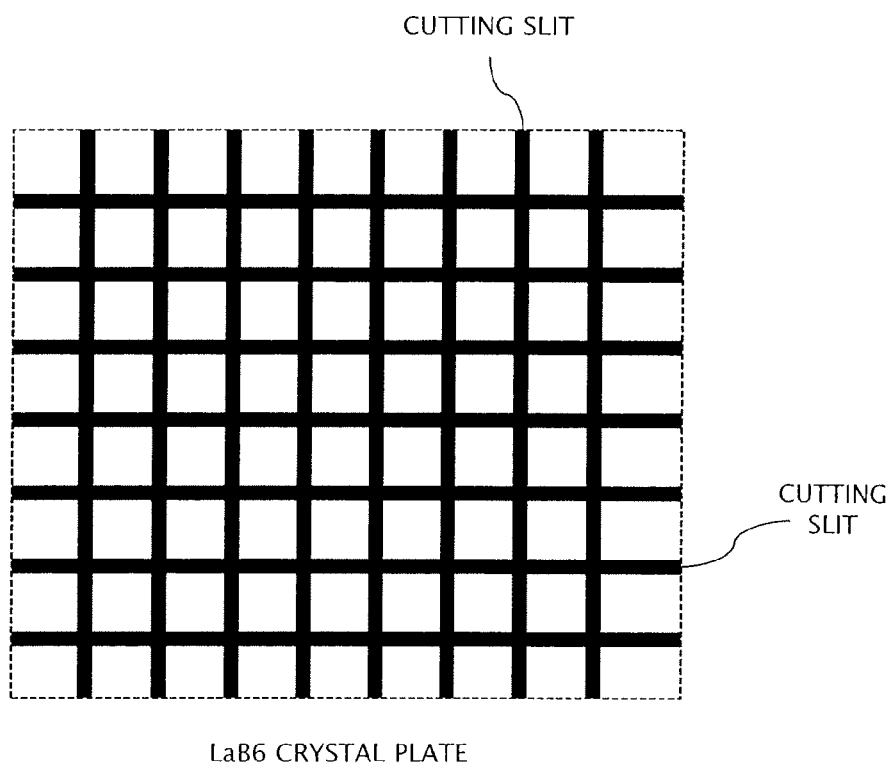
FIG. 4 View for explaining manufacture of an electron gun cathode.
Figure 5:
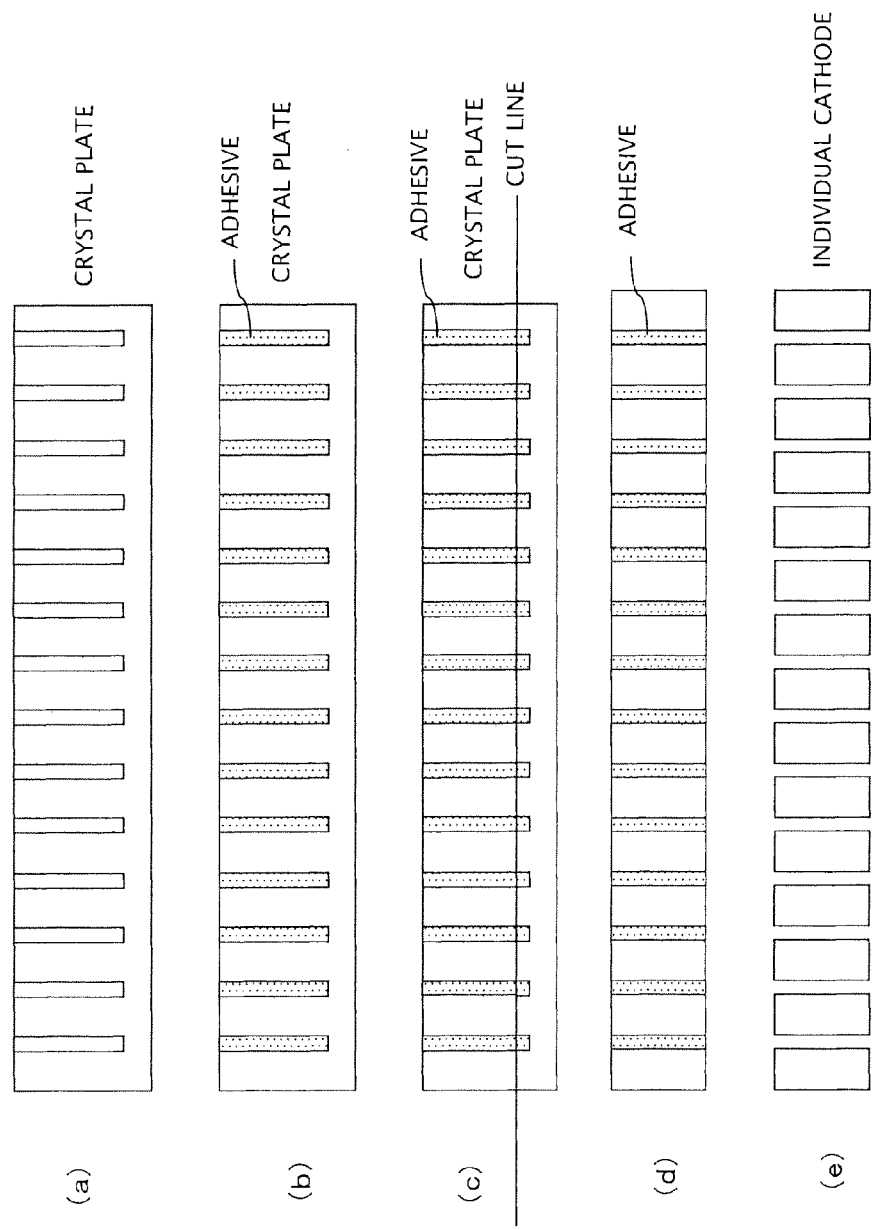
FIG. 5 View for explaining manufacture of an electron gun cathode.

In the present embodiment, the electron gun cathode 104 is in the shape of a square column. FIG. 3 is a view of the electron gun cathode 104 as seen from the tip side. As illustrated, four corners of the electron gun cathode 104 are held by the cylindrical hole of the holder 103 in a contacting manner. Here, the electron gun cathode 104 is in a square column shape for the ease of manufacturing. As illustrated in FIG. 4, a plurality of cut slits are formed by a blade on a plate-like LaB6 crystal in the horizontal and vertical directions from a top surface thereof. These cut slits, seen in a cross section parallel to the cut slits in one direction, are illustrated in FIG. 5(a). Then, as illustrated in FIG. 5(b), an adhesive is injected and hardened in the cut slits. Thereafter, the plate is cut by a blade across the slits in a direction parallel to the top surface (indicated as a cut line) as illustrated in FIG. 5(c), so as to obtain a set of square columns hardened with the adhesive in the slits in a plate shape, as illustrated in FIG. 5(d). Then, the adhesive is melted by a solvent and removed, so that a large number of electron gun cathodes 104 in the square column shape as illustrated in FIG. 5(e) can be obtained.

The electron gun cathode 104 includes a tip flat surface of about 50 μm×50 μm and has a length of 100 μm. It is very difficult to machine the electron gun cathode 104 having such a small size with a lathe or the like. Further, in the case of cutting such a small electron gun cathode 104 by a blade, the electron gun cathode will fly upon separation from the crystal substrate. The machining method described above enables effective manufacturing of the small electron gun cathode 104.

Here, an LaB6 crystal chip is likely to be cracked. It is very likely that a chip having a crack will have unstable thermal properties when it is heated, making it impossible to maintain the temperature in a stationary state, which results in unstable properties. This often leads to a variation in the position to which electron beams are emitted and a variation in the angles of radiation, making the properties of the electron gun unstable.

However, as the electron gun cathode 104 according to the present embodiment has a size of 50 μm×50 μm×100 μm and has a small volume as a crystal, the electron gun cathode 104 hardly has cracks. Consequently, the temperature characteristics are stable upon heating and there is little variation in the beam position, so that the electron emission properties are extremely stable.

According to the present embodiment, there is used the thermal field emission (TFE) type electron gun 100 in which the electron gun cathode 104 is heated and also an electric field is caused to act on the electron gun cathode 104 to extract electrons, and an electric field having an electric field intensity of about 0.5 to $1.0 \times 10^6$ V/cm is applied to the tip of the electron gun cathode 104, which is also heated to about 1650 to 1700 K. Further, LaB6 or CeB6 is used as a material of the electron gun cathode 104, which is then held by the holder 103 formed of rhenium. As rhenium is hard to react with LaB6 or CeB6 at the above-described temperatures, it is possible to effectively prevent deterioration of the electron gun cathode 104 caused by a chemical reaction therebetween.

Figure 6:
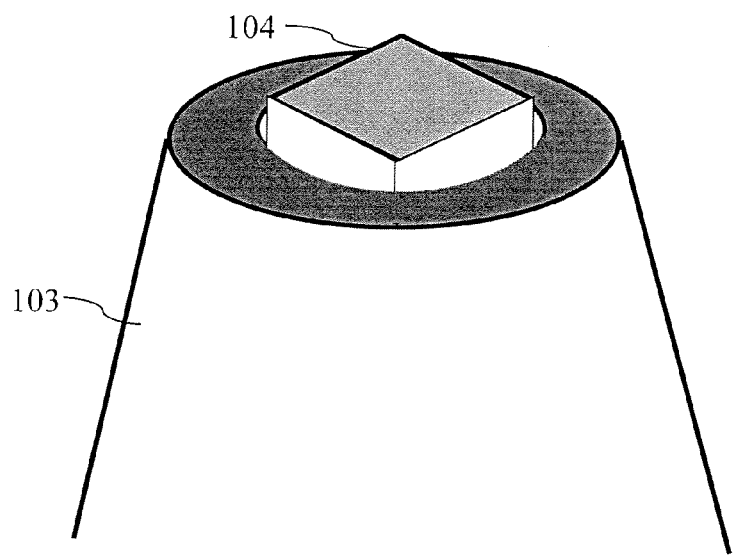
FIG. 6 View illustrating configurations of a holder and an electron gun cathode.

Also, in the present embodiment, only the tip of the electron gun cathode 104, which is a flat surface of 50 μm×50 μm, protrudes from the rhenium holder 103, as illustrated in FIG. 6. This protruding amount is set to 2 to 15 μm. As such, because most of the side surfaces of the electron gun cathode 104 having a length of 100 μm are covered with the holder 103, it is possible to reduce sublimation of the electrons and materials from the side surfaces of the electron gun cathode 104. Also, as irradiation of electrons from the side surfaces of the electron gun cathode 104 is reduced, excess heating of peripheral members can be minimized.

In other words, it is possible to reduce the electrons discharged from the whole electron gun cathode 104, including the side surfaces of the tip portion, and also to reduce sublimation and evaporation of the material. The area of sublimation, which conventionally has been several square meters, can be reduced to 2500 square microns, which is one 200th or less in terms of the area ratio. It is therefore possible to suppress formation of whiskers of sublimation adhering substances on the surfaces of the electron gun anode 107 and the extraction electrode 106 and extend the time until discharge occurs, thereby achieving extension in life time.

It is also possible to suppress thinning and narrowing of the side surface of the electron gun cathode material to thereby maintain the initial state of extraction of electrons for a long period. Further, in the case of LaB6, it is possible to prevent boron (B) atoms and lanthanum (La) atoms from being removed from the crystal, to thereby maintain the initial state of extraction of electrons for a long period.

Concerning the holder 103 formed of rhenium, there is adopted a holder including a base portion having a diameter of 1000 μm and a tip portion having a diameter of about 100 μm, and having a length of about 1 mm to 2 mm.

Figure 7:
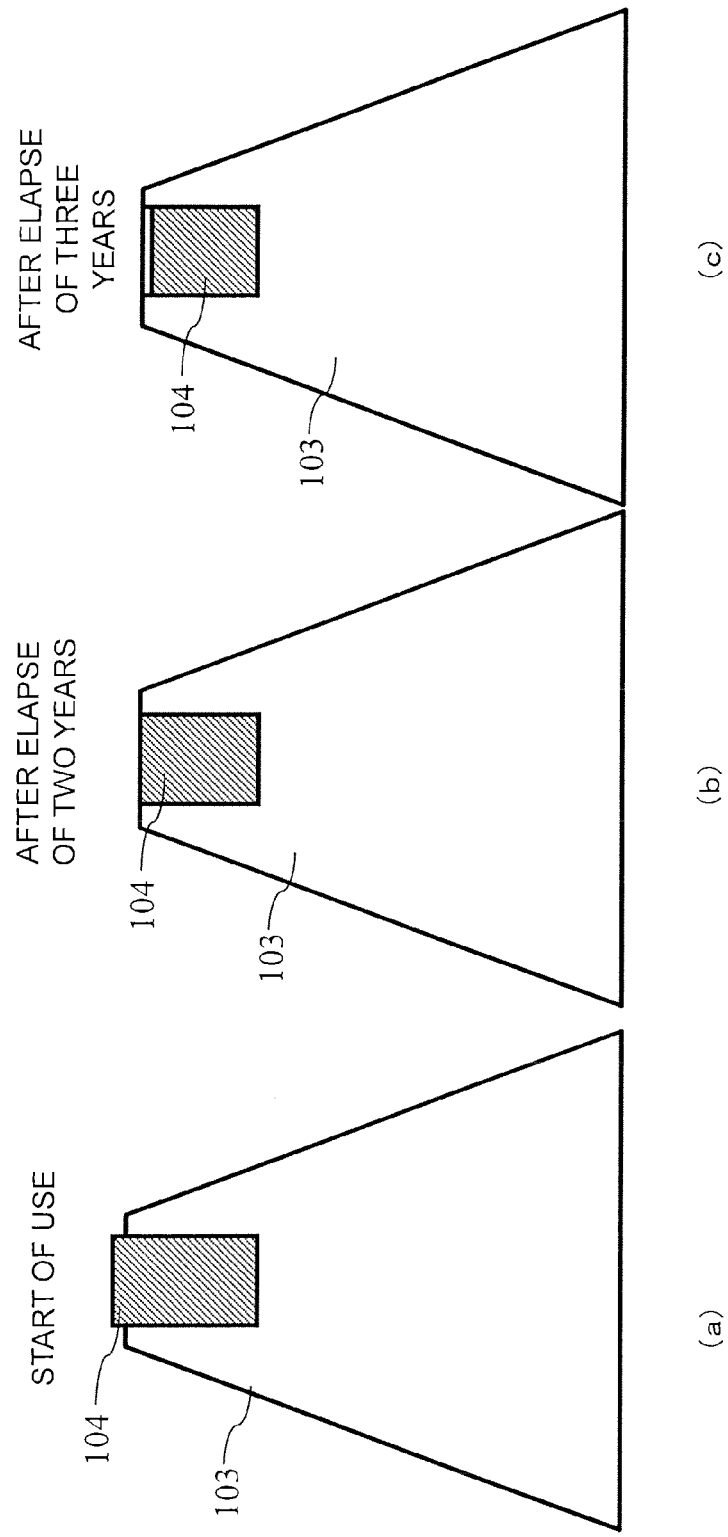
FIG. 7 View for explaining the worn state of an electron gun cathode.

As described above, in the present embodiment, wear of the electron gun cathode 104 due to use is relatively small. However, it is inevitable that the electron gun cathode 104 wears due to its use. In the present embodiment, the volume of the electron gun cathode 104 would be gradually reduced starting from the tip surface, as illustrated in FIG. 7. FIGS. 7(*a*), 7(*b*), and 7(*c*) schematically illustrate example states of the electron gun cathode at the start of use, after elapse of two years, and after elapse of three years, respectively.

If the protruding amount of the electron gun cathode 104 is great, emission and sublimation of electrons from the side surfaces increases accordingly, which is not desirable. On the other hand, as wear caused by the use cannot be avoided, if the tip of the electron gun cathode 104 is lowered into the hole of the holder 103 as illustrated in FIG. 7(*c*), extraction of electrons cannot be performed preferably. Therefore, in order to maximize the life time and simultaneously reduce formation of whiskers on the extraction electrode 106 and the like, the protruding amount of the electron gun cathode 104 from the holder 103 at the start of use is preferably 2 to 15 μm, particularly preferably 10 μm.

Here, if the surface areas of the upper flat portions of the electron gun cathode 104 and the holder 103 are reduced, the concentration of the electric field can be increased so that the electric field intensity and the electron generation efficiency can also be increased. Accordingly, a reduction in the area of the flat surface at the tip can further increase the brightness. Specifically, while in the above example, the flat surface at the tip is about 50×50 μm, a further reduction in this area can achieve higher brightness. At this time, it is necessary to reduce the area of the holder 103 simultaneously. In the case of a variable shaped beam and a cell projection beam (CP), it is necessary to irradiate a predetermined area uniformly. In other words, uniform illumination is necessary, or large emittance is necessary.

Further, in the present embodiment, the holder 103 formed of rhenium has a tapered shape toward the tip which is shaped to project sharply. The holder 103 holds the electron gun cathode 104 at the electron gun holding portion at the tip thereof so as to cover the bottom and side surfaces of the electron gun cathode 104. Accordingly, concerning the electric field around the electron gun cathode, the equipotential line thereof has a shape of a sharp curve corresponding to the shape of the tip of the holder 103, so that strong electric field is applied to the tip portion. Consequently, emission of electron beams from the tip of the electron gun cathode 104 can be promoted.

Further, the electron gun cathode having a flat surface at the tip, which is described in the above example, is suitable for a variable shaped beam or cell projection beam (CP) exposure device.

"Other Example Configurations of Electron Gun"

In the case of using a single spot beam, an electron gun cathode 104 having a pointed tip can also be adopted. A cathode having such a shape is suitable for an electron beam inspection device such as a scanning electron microscope (SEM). In the present specification, electron beam exposure devices and electron beam inspection devices such as electron microscope will be collectively referred to as electron beam devices.

An electron microscope (SEM), similar to the electron beam exposure device, radiates an electron beam emitted from the electron gun onto a sample as a spot and simultaneously scans this beam. Secondary electrons or the like generated from the sample are detected by a detector and the detection results are imaged. The electron gun according to the present embodiment is also applicable to an electron beam inspection device such as a transmission electron microscope.

Figure 8:
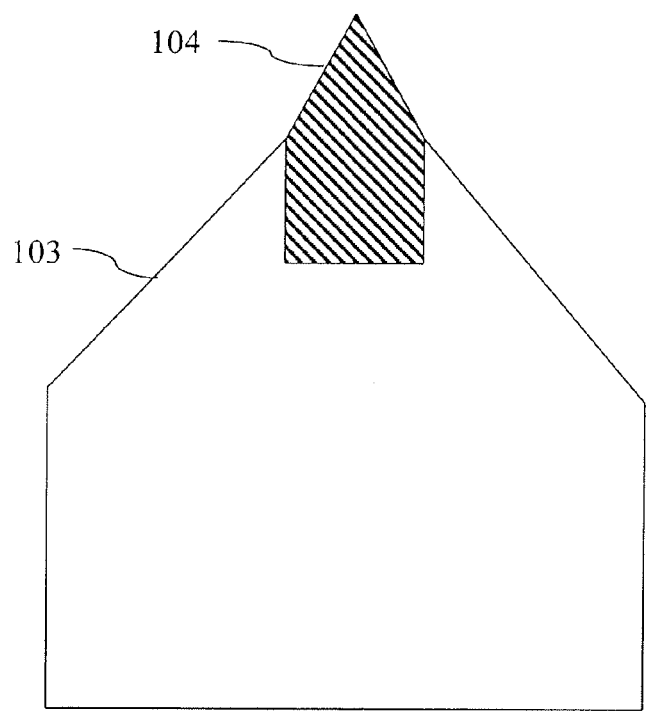
FIG. 8 View illustrating another example configuration of a holder and an electrode gun cathode.

FIG. 8 illustrates an example in which the electron gun cathode 104 having a column shape to be embedded in the tip of the holder 103 has a pointed tip. More specifically, the electron gun cathode 104 is inserted into the tip of the holder 103, and the tip portion of the electron gun cathode 104 has a conical shape with the diameter thereof being gradually reduced toward the tip.

Such a shape enables a reduction in the quantities of sublimation and evaporation from the electron gun cathode 104 and also enables a reduction in the quantity of the electron gun cathode materials adhering to the extraction electrode 106 and the electron gun anode 107, so that the life time determined by discharge caused by growing whiskers can be extended.

Figure 9:
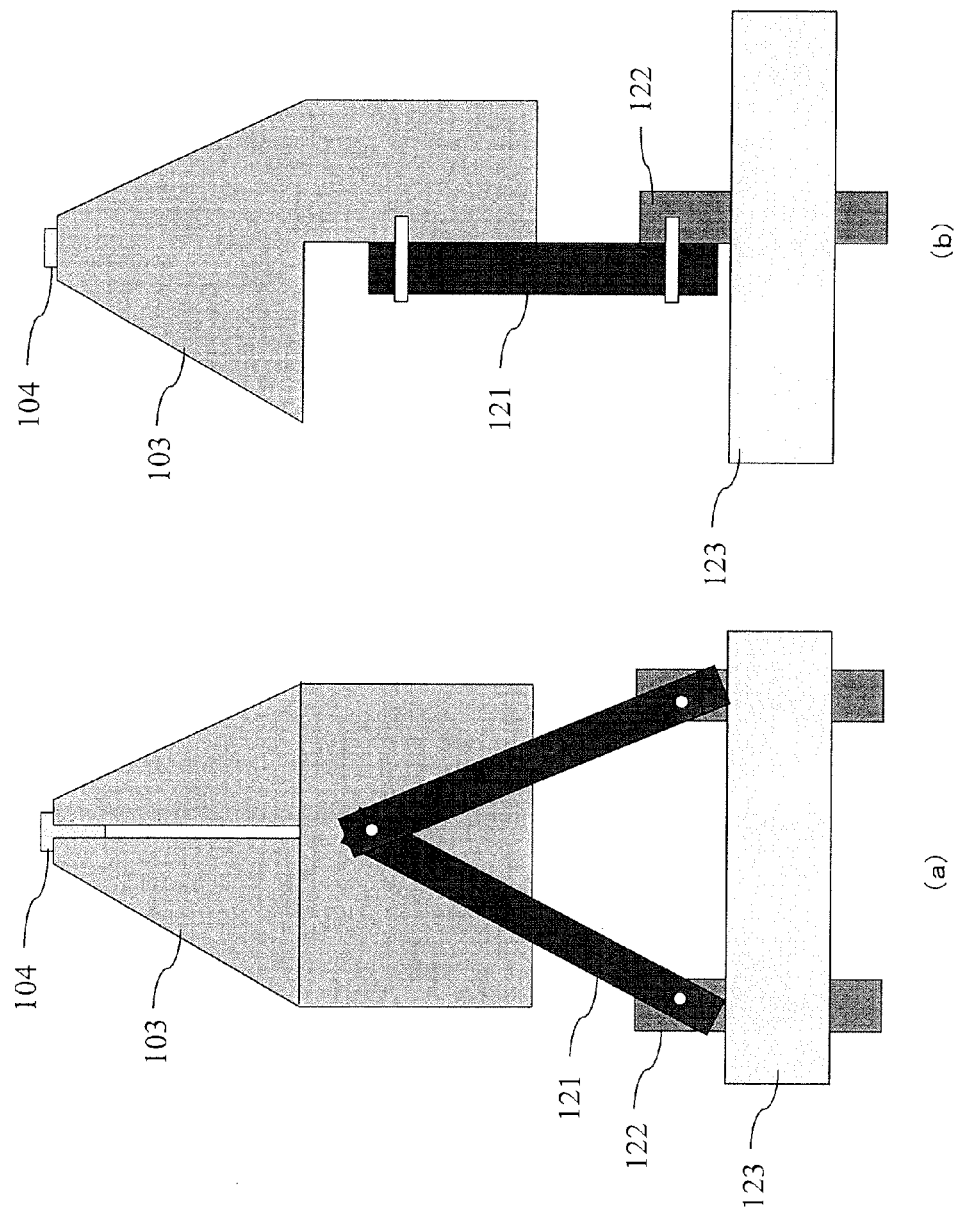
FIG. 9 View illustrating another example configuration of a holder and an electrode gun cathode.

FIG. 9 illustrates a tungsten filament heating type electron gun. FIG. 9(a) is a front view and FIG. 9(b) is a side view.

As illustrated, while the tip side of the holder 103 is similar to the example described above, a half of the base side is cut away to form a semicylinder shape. Further, upper end portions of a pair of tungsten filaments 121 that are arranged in an inverted V-shape are spotwelded on a flat surface of this semicylinder.

A pair of lower end portions of the pair of tungsten filaments that are spaced from each other are spot welded to a pair of metal bars 122 fixed to a ceramic substrate 123. When electric power is supplied between the pair of metal bars 122, the tungsten filaments 121 are heated to thereby heat the electron gun cathode 104 via the holder 103. Here, all of the metal bars 122, the tungsten filaments 121, and the electron gun cathode 104 are maintained at the same cathode potential (direct current voltage), and radiation of electrons from the electron gun cathode 104 is performed in the same manner as in the above example.

"Configuration of Electron Beam Device"

Figure 10:
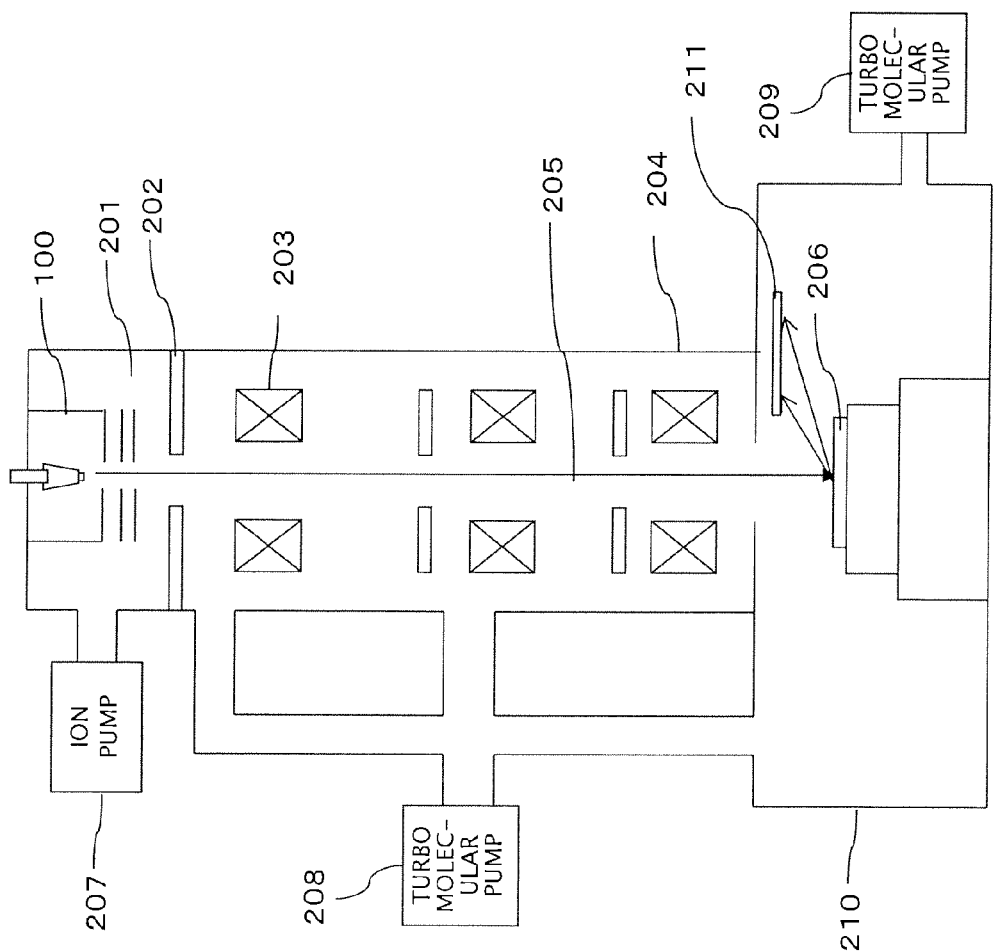
FIG. 10 View schematically illustrating a configuration of an electron beam exposure device.

FIG. 10 schematically illustrates a structure of an electron beam exposure device in which the electron gun 100 described above is utilized. A lens barrel 204 is a sealed cylinder including an electron gun chamber 201 formed in the upper portion thereof by being partitioned with partitions 202. A lens deflection optics 203 which functions as a beam controller and is composed of a coil, magnetic lens, and so on, is disposed inside the lens barrel 204 in order to deflect, shape, and converge an electron beam 205 extracted from the electron gun 100. Further, below the lens barrel 204, a target chamber 210 is disposed, where a target 206, which is a substrate (wafer) on which drawing is performed, is placed.

With the above configuration, the electron beam 205 extracted from the electron gun 100 is controlled to be converged onto a desired position on the target 206, so that drawing by means of electron beams is performed. Here, an ion pump 207 exhausts the interior of the electron gun chamber 201, a turbo molecular pump 208 exhausts the interior of the lens barrel 204, and a turbo molecular pump 209 exhausts the interior of the target chamber 210, to maintain the respective interiors in a desired vacuum state. The present device includes a secondary electron or reflected electron detector 211 and therefore can achieve not only electron beam lithography but also image observation by scanning the electron beams. The present device can also be used as an electron beam inspection device for inspecting an image on a wafer or mask substrate.

"Configuration of Multi-Column"

The electron gun according to the present embodiment can be preferably applied to a multi-column electron beam exposure device. The multi-column electron beam exposure device is composed by two-dimensionally arranging a single column element having a thickness of about 15 mm to 50 mm, for example, in plural numbers such as several tens or more (e.g. 30 to 250 or more) to thereby form a multi-column group for emitting a plurality of electron beams on a single wafer. Such a structure enables high-speed exposure processing.

Figure 11:
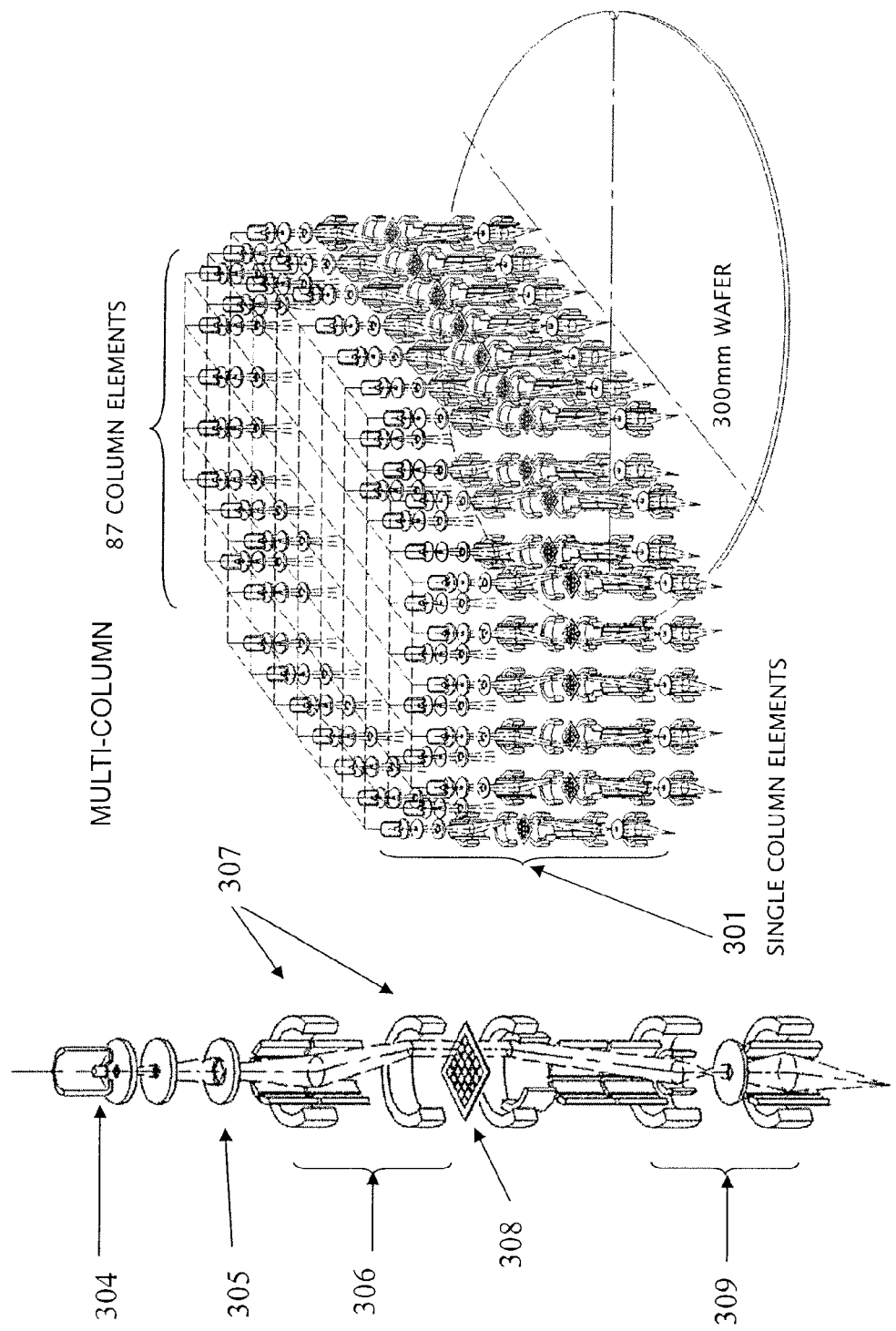
FIG. 11 View illustrating a single column

FIG. 11 illustrates a multi-column electron beam lithography device, in which 89 fine unit column elements, each column element having a diameter of 25 millimeters, are arranged on a 300 mm wafer. FIG. 11 also schematically illustrates a configuration of a single column element 301 of the 89 column elements. An electron beam emitted from an electron gun 304 is shaped into a rectangular shape by a first rectangular aperture 305, and imaged on a second aperture or a CP mask 308 by means of a lens and deflection optics 306 in the first stage. The electron beam on the second aperture or the CP mask 308 is reshaped into a beam of a desired size or shape by a beam deflector. The beam is further deflected to and imaged on, by a lens and deflection optics 309 in the second stage, an appropriate position on a wafer located below. These lens and polarization optics 306 and 309 function as a beam controller, which can be further divided into magnetic field lenses 307.

"Configuration of Power Source of Optical Heating System"

Figure 12:
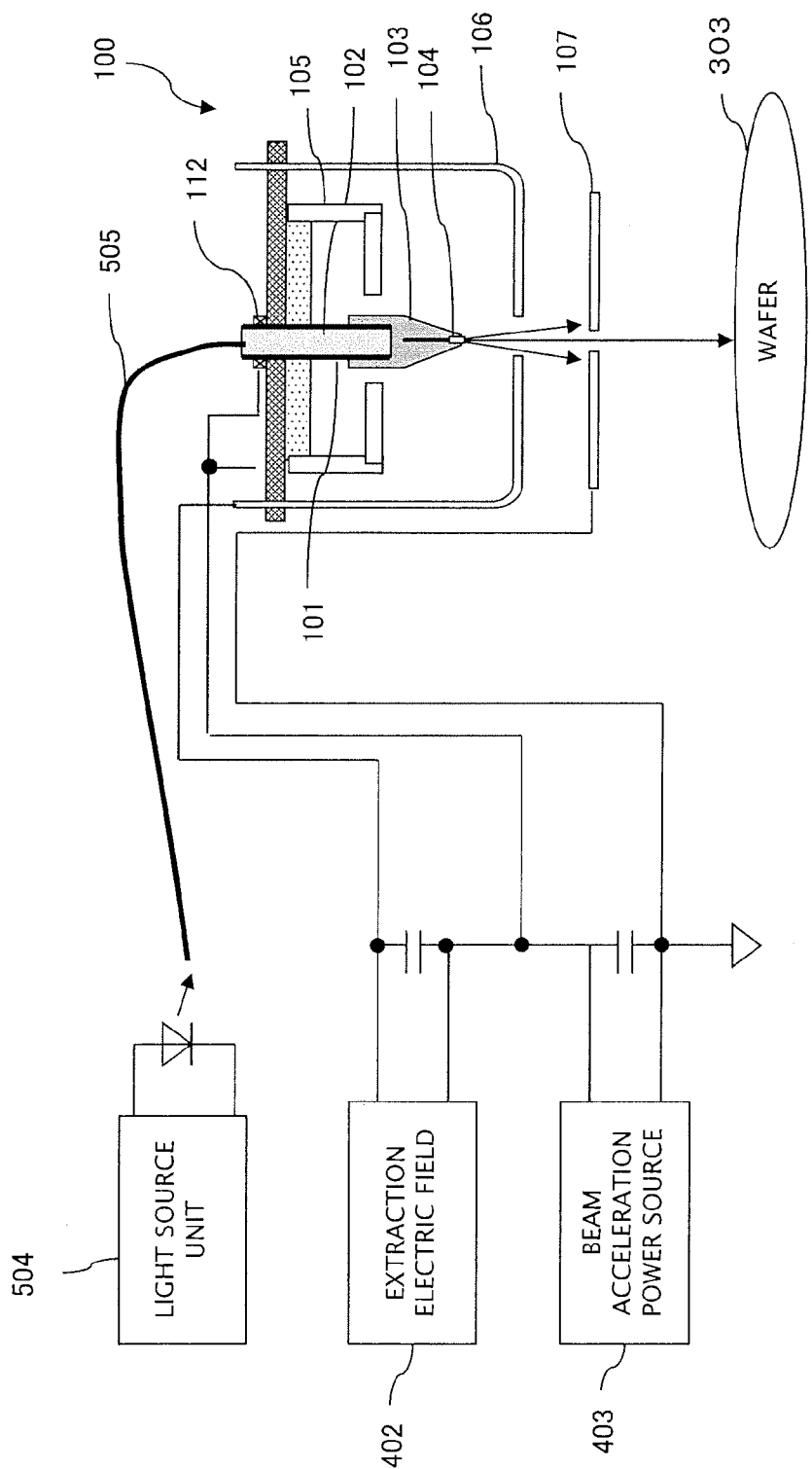
FIG. 12 View illustrating a structure of voltage supply control to an electron gun.
Figure 13:
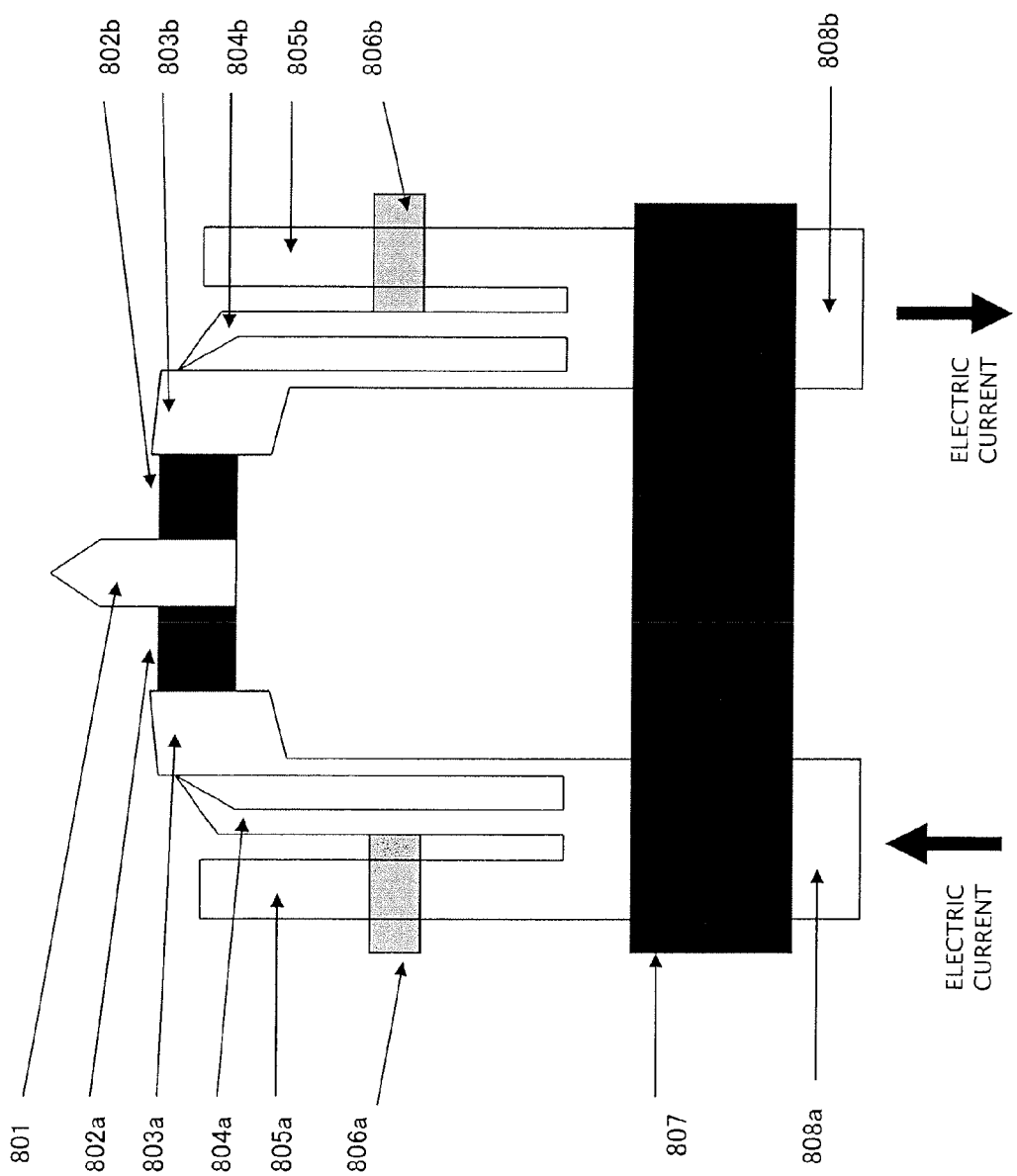
FIG. 13 View illustrating a conventional Vogel mount type electron gun.
Figure 14:
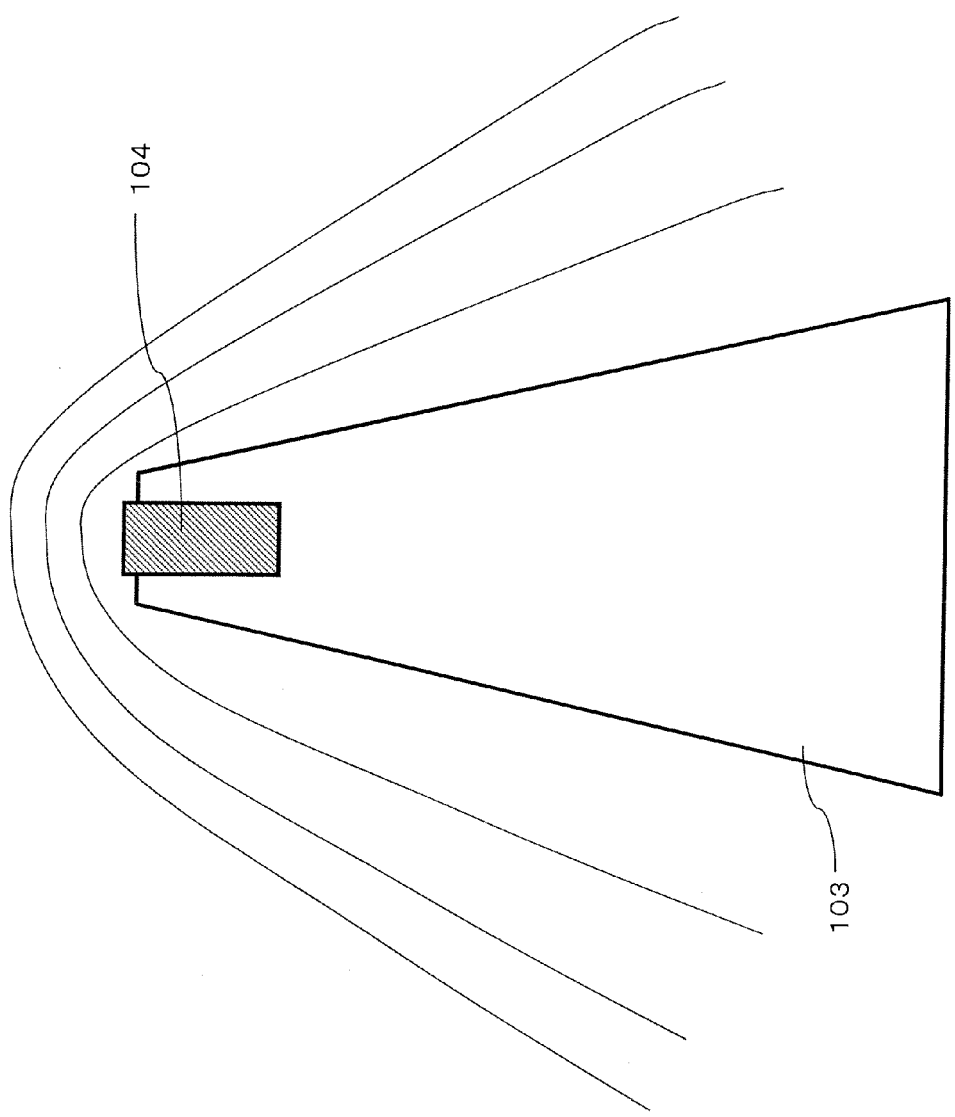
FIG. 14 View illustrating a state of an electric field around an electron gun cathode.

As described above, light is preferably used for heating the electron gun. FIG. 12 is a view illustrating the configuration of an optical heating type electron gun according to the present embodiment and a control section of the electron gun.

An electron beam acceleration power source 403 is a high voltage generation unit for supplying a high voltage of minus several tens of kV (e.g., about −50 kV) to the electron gun cathode 104, and applies the voltage to the electron gun cathode 104 via the conductive ring 112, and the metal film 101 on the surface of the optical waveguide 102.

An extraction electric field power source 402 generates a voltage of plus several kV (about +3 kV to +10 kV) with respect to the electron beam acceleration power source 403 and applies the voltage to the extraction electrode 106.

A light source unit 504 includes a semiconductor laser and a control section thereof, and is a unit for generating light and adjusting the intensity of light.

An optical fiber 505 is a light transmitting path for guiding light from the light source unit 504 to the optical waveguide 102. As the thickness of one optical fiber is about 250 micron, several tens of these optical fibers bound together would result in a size having a diameter of about 2.5 mm. As, contrary to the case of electrical lines, no special electric insulation needs to be applied to the optical fiber 505, which is made of an insulating material such as glass or plastic, the optical fiber 505 can be introduced, in its original form, to the high voltage electron gun section of minus several tens of kV (e.g., about −50 kV). In the conventional heating method, which is an electric current heating method, a thick conductive cable, which is high voltage insulated, having a diameter of several centimeters or more is used. Because such a cable has a heavy weight and high rigidity and is hard, floor vibration propagates to the cable to cause the electron optical lens barrel to vibrate, which results in vibration of the beams and deterioration in accuracy of lithography.

Light energy supplied to the electron gun 100 heats the holder 103 and the electron gun cathode 104 to a high temperature near 1500° C. and is dissipated as radiant heat of these members and as conductive heat through the optical waveguide 102. Therefore, the intensity of light is adjusted such that the temperature of the electron gun cathode 104 maintains a fixed value near 1500° C. Actually, as it is difficult to detect the temperature of the individual electron guns in a multi-column configuration generally including several tens of column elements or more, the light source unit 504 is controlled to measure the intensity of the electron beam, which is extracted by the extraction electrode 106 as a thermal field emission electron flow, is accelerated by the electron gun anode 107, and flows into the wafer 303, and to maintain the measured value to a fixed value. Secondarily, as a light quantity monitor is provided in the semiconductor laser, the semiconductor laser output is controlled to make the light quantity fixed.

As described above, according to the present embodiment, because light is used for heating, the optical fiber 505 is separated from the high voltage system and therefore can be handled in an easy manner. Further, in the present embodiment, as the cable for transmitting the light energy is thin and light and has low rigidity, almost no floor vibrations propagate to the cable, which allows highly accurate lithography.

A problem of a multi-column electron gun is heat generation by an electron gun cathode. If the holder 103 of one electron gun has an area of several square millimeters and the temperature is 1700K, the heating power would be a value obtained by multiplying several watts, which is a heating power determined by a product of the area of the high temperature portion and a fourth power of the temperature thereof, by the number of the electron guns in a multi-column configuration. The degree of vacuum in the electron gun chamber 201 may therefore be deteriorated. In order to avoid deterioration of the degree of vacuum, it is effective to reduce the surface area of the holder 103. For example, halving the thickness and length can reduce the heating power to about one-fourth, which is 100 watts or less, allowing a reduction in deterioration of the degree of vacuum. As such, a reduction in the temperature and the area of the electron gun high temperature portion is significant. It is thus preferable that the base portion of the holder 103 includes a shorter portion with a larger diameter and a longer portion with a smaller diameter. In order to reduce the area, it is also possible to form the holder with a thin wire within a range which does not change the whole structure.

When an electron gun cathode including a tip which is a 50 μm square flat surface is applied to an electron beam lithography device, the brightness is 3 to $6 \times 10^6$ A/cm$^2$ steradian, and the electron gun emittance representing the irradiation uniformity of the first rectangular aperture can be 7 to 10 mrad urn, which is an ideal electron gun having a life time of 2 to 3 years. This can lead to significant contribution to practical use of electron beam lithography devices. It is also possible to provide enormous contribution to an improvement of scanning transmission electron microscopes and to an improvement of electron beam inspection devices.

In the above embodiment, the holder 103 as whole is formed of rhenium, so as to suppress the chemical reaction with the electron gun cathode 104 formed of LaB6 and so on. Accordingly, so long as a portion of the holder 103 which contacts the electron gun cathode is formed of rhenium, other portions of the holder 103 may be formed of other materials, such as tungsten, tantalum, molybdenum, and so on, which have high rigidity.

REFERENCE SYMBOLS LIST

100, 304 electron gun, 101 metal film, 102 optical waveguide, 103 holder, 103*a*, 103*b* slit, 104 electron gun cathode, 105 suppressor electrode, 106 extraction electrode, 107 electron gun anode, 205 electron beam, 109, 110 insulation base, 112 conductive ring, 121 tungsten filament, 122 metal bar, 123 ceramic substrate, 201 electron gun chamber, 202 partition, 203 lens and deflection optics, 204 lens barrel, 206 target, 207 ion pump, 208, 209 turbo molecular pump, 210 target chamber, 211 secondary electron or reflection electron detector, 301 single column element, 303 wafer, 305 first rectangular aperture, 306, 309 lens and deflection optics, 307 magnetic field lens, 308 second rectangular aperture or CP mask, 402 extraction electric field power source, 403 electron beam acceleration power source, 504 light source unit, 505 optical fiber, 801 electron gun cathode material which is a single crystal of LaB6 or CeB6, 802*a*, 802*b* pyrolytic graphite members cut in C-axis direction, 803*a*, 803*b* metal support, 804*a*, 804*b* metal spring, 805*a*, 805*b* support for spring adjustment screw, 806*a*, 806*b* spring adjustment screw, 807 alumina ceramics, 808*a*, 808*b* electron gun cathode heating current introduction terminal.

The invention claimed is:

1. An electron gun, comprising:
   an electron gun cathode for emitting electrons by being heated, the electron gun cathode having a column shape; and
   a holder configured to cover bottom and side surfaces of the electron gun cathode in an electron gun holding portion at a tip portion thereof and hold the electron gun cathode, the holder having electrical conductivity and being formed of a material that is hard to react with the electron gun cathode in a heated state, and the holder having a truncated-conical shape that is tapered as a whole and projecting toward the electron gun holding portion,
   wherein
   the electron gun cathode has a square column shape and the holder includes, at the tip portion, a cylindrical recess portion as the electron gun holding portion, and, with the electron gun cathode having the square column shape being inserted in the cylindrical recess portion, the electron gun cathode is held in the holder, and
   the electron gun cathode has a square flat surface at a tip thereof, the tip being exposed to protrude from the holder, and, with application of an electric field to the tip, the electron gun cathode emits electrons from the flat surface at the tip toward a forward direction.

2. The electron gun according to claim 1, wherein the electron gun cathode is formed of one material selected from lanthanum hexaboride compounds including LaB6 and CeB6.

3. The electron gun according to claim 1, wherein the holder is formed of rhenium.

4. The electron gun according to claim 1, wherein
   the holder is coupled with an optical waveguide on a base side of the holder opposite the tip side thereof where the electron gun is held, and
   the electron gun cathode is heated, via the holder, by light supplied through the optical waveguide.

5. An electron beam device comprising:
   an electron gun;
   a beam controller configured to extract electrons from the electron gun and direct the electrons; and
   a target holding portion for holding a target to be irradiated with the electrons from the beam controller,
   wherein the electron gun comprises:
   an electron gun cathode having a column shape, the electron gun emitting electrons by being heated; and
   a holder configured to cover bottom and side surfaces of the electron gun cathode and hold the electron gun cathode in an electron gun holding portion at a tip portion thereof, the holder having electrical conductivity and being formed of a material that is hard to react with the electron gun cathode in a heated state and the holder having a truncated-conical shape that is tapered as a whole and projecting toward the electron gun holding portion,
   wherein
   the electron gun cathode has a square column shape and the holder includes, at the tip portion, a cylindrical recess portion as the electron gun holding portion, and, with the electron gun cathode having the square column shape being inserted in the cylindrical recess portion, the electron gun cathode is held in the holder, and the electron gun cathode has a square flat surface at a tip thereof, the tip being exposed to protrude from the holder, and, with application of an electric field to the tip, the electron gun cathode emits electrons from the flat surface at the tip toward a forward direction.

\* \* \* \* \*